(12) United States Patent
Keuper

(10) Patent No.: US 7,535,168 B2
(45) Date of Patent: May 19, 2009

(54) LIGHT-EMITTING DIODE, LIGHTING DEVICE AND METHOD OF MANUFACTURING SAME

(75) Inventor: Matthijs Hendrik Keuper, Eindhoven (NL)

(73) Assignee: Philips Lumiled Lighting, U.S. LLC, San Jose, CA (US)

( * ) Notice: Subject to any disclaimer, the term of this patent is extended or adjusted under 35 U.S.C. 154(b) by 0 days.

(21) Appl. No.: 09/803,999

(22) Filed: Mar. 12, 2001

(65) Prior Publication Data
US 2004/0212291 A1    Oct. 28, 2004

(30) Foreign Application Priority Data
Mar. 14, 2000   (EP) ................................. 00200922

(51) Int. Cl.
*H01R 33/12*   (2006.01)
(52) U.S. Cl. ..................................... 313/506
(58) Field of Classification Search ............... 313/483, 313/112, 113, 497, 498–512; 257/89, 98, 257/97, 13, 94, 103; 362/293, 260, 263, 362/265; 349/113, 112, 71
See application file for complete search history.

(56) References Cited

U.S. PATENT DOCUMENTS

| | | | | |
|---|---|---|---|---|
| 4,081,764 A | * | 3/1978 | Christmann et al. | 372/43.01 |
| 4,822,144 A | * | 4/1989 | Vriens | 349/71 |
| 5,614,786 A | * | 3/1997 | Nakamura et al. | 313/497 |
| 6,013,982 A | * | 1/2000 | Thompson et al. | 313/506 |
| 6,218,774 B1 | * | 4/2001 | Pope | 313/461 |
| 6,352,254 B1 | * | 6/2001 | Souls et al. | 257/89 |
| 6,294,800 B1 | * | 9/2001 | Duggal et al. | 257/89 |
| 6,320,633 B1 | * | 11/2001 | Broer et al. | 349/113 |
| 6,357,889 B1 | * | 3/2002 | Duggal et al. | 362/84 |
| 6,373,188 B1 | * | 4/2002 | Johnson et al. | 313/506 |
| 6,696,703 B2 | | 2/2004 | Mueller-Mach et al. | |

FOREIGN PATENT DOCUMENTS

WO    0939805    9/1998

* cited by examiner

*Primary Examiner*—Alexander Gilman
(74) *Attorney, Agent, or Firm*—Azir U. Haque

(57) ABSTRACT

A light-emitting diode comprises a chip emitting visible light of a first wavelength, a light-emitting surface and a phosphor layer provided on the light-emitting surface. Said phosphor layer is capable of converting light of the first wavelength to visible light of a second wavelength. According to the invention, a part of the light-emitting surface is not covered with the phosphor layer. Preferably, the size of said surface is chosen to be such that by mixing emitted light of the first and the second wavelength substantially white light is obtained. Preferably, the surface that is not covered with the phosphor layer comprises a plurality of sub-surfaces, preferably arranged in the form of a pattern.

8 Claims, 2 Drawing Sheets

LIGHT-EMITTING DIODE, LIGHTING DEVICE AND METHOD OF MANUFACTURING SAME

BACKGROUND

1. Field of Invention

The invention relates to a light-emitting diode comprising a chip capable of emitting visible light of a first wavelength, a light-emitting surface and a phosphor layer which is provided on the light-emitting surface and which is capable of converting light of the first wavelength to visible light of a second wavelength.

2. Description of Related Art

Such a light-emitting diode (LED) is well known. In the case of an LED, the chip emits colored light of one specific wavelength. Hitherto, LEDs were predominantly used as signal lamps, but as a result of the increased light output, LEDs are increasingly used, at present, to illuminate objects. In many applications there is a trend towards illuminating an object with light of a different color, particularly light comprising different wavelengths, for example substantially white light, which is the reason why the light-emitting surface of the known LED is provided with a phosphor layer which partially absorbs the light (of a short wavelength) which is emitted by the chip and converts said light to light of a different (longer) wavelength. By providing the phosphor layer in a thickness such that only an accurately determined part of the light emitted by the chip is converted to said other color, the desired result, for example substantially white light, can be achieved as a result of the fact that both colors mix.

The above-described LED has the disadvantage that in order to obtain a light output having a predetermined, accurate color temperature, the thickness of the phosphor layer must be very accurately controlled, which is a complex process. As a result, in practice, variations in the thickness of this layer occur, which may lead to undesirable color deviations, which may range from several thousand to several hundred Kelvin in color temperature.

WO 98/39805 discloses a light-emitting diode whose light-emitting surface is surrounded by a transparent mass comprising a mixture of three different types of phosphor emitting, respectively, blue, green and red light. By accurately controlling the composition of the phosphor mixture, light of the desired color can be obtained. A drawback of this diode resides in that a large quantity of the phosphor mass must be cast around the chip because all the (ultraviolet) light emitted by the chip must be converted to visible light.

BRIEF SUMARY OF THE INVENTION

It is an object of the invention to provide a light-emitting diode having a high light output and a small light-emitting surface, which light-emitting diode is cheap and simple to manufacture, and which enables light of an accurately defined light temperature to be obtained.

To achieve this, in accordance with the invention, the light-emitting surface comprises a sub-surface without the phosphor layer. From the sub-surface without the phosphor layer issues light (preferably blue light) of the first wavelength (for example approximately 480 nm), which corresponds to the light emitted by the chip (preferably an InGaN chip), and from the sub-surface with the phosphor layer issues the converted light (preferably yellow light) of the second wavelength (for example approximately 575 nm). If both colors mix, light of a different color is obtained. Consequently, the color temperature can be accurately controlled by the choice of the size of the sub-surface. In a preferred embodiment, the size of the sub-surface is such that mixing the emitted light of the first and the second wavelength results in substantially white light. If necessary, a third sub-surface can be covered with a layer of a second type of phosphor which emits light of a third wavelength. In this manner, any desired color can be accurately obtained.

Preferably, the phosphor layer is provided on the diode by means of a well-established technique such as screen printing.

Preferably, the thickness of the phosphor layer is such that all the light of the first wavelength incident on the phosphor layer is converted to light of the second wavelength. As a result, unlike the prior art, the thickness of the phosphor layer does not influence the color temperature.

Preferably, the sub-surface without a phosphor layer, or the sub-surface on which the phosphor layer is provided, is distributed over a plurality of partial sub-surfaces, said partial sub-surfaces preferably forming a pattern, such as a simple chessboard pattern. This pattern is preferably very finely distributed, so that a good mixture of the light is obtained. In certain applications, too coarse a pattern may cause the color pattern to be undesirably projected on the object to be illuminated. To further reduce this effect, a lighting unit wherein a light-emitting diode in accordance with the invention is incorporated preferably comprises optical elements to mix the emitted light of the first and the second wavelength.

In a preferred embodiment, the sub-surface without a phosphor layer is at least partly covered with a light-transmitting layer, which is capable of spreading light incident on said sub-surface. Preferably, the thickness of the light-transmitting layer is the same as that of the phosphor layer, so that the outermost surface of the diode is a flat surface.

The invention also relates to a lighting device comprising at least one light-emitting diode including a chip which is capable of emitting visible light of a first wavelength, a light-emitting surface and a phosphor layer which is provided on the light-emitting surface and which is capable of converting light of the first wavelength to visible light of a second wavelength, said light-emitting surface comprising a sub-surface without the phosphor layer.

The invention also relates to a method of manufacturing a light-emitting diode, wherein a chip, which is capable of emitting visible light of a first wavelength, is at least partly surrounded by a light-emitting surface, and a phosphor layer is provided on the light-emitting surface, which phosphor layer is capable of converting light of the first wavelength to visible light of a second wavelength, and the phosphor layer is removed from, or not provided on, a sub-surface of the light-emitting surface.

These and other aspects of the invention will be apparent from and elucidated with reference to the embodiment(s) described hereinafter.

DETAILED DSCRIPTION

Figure 1:
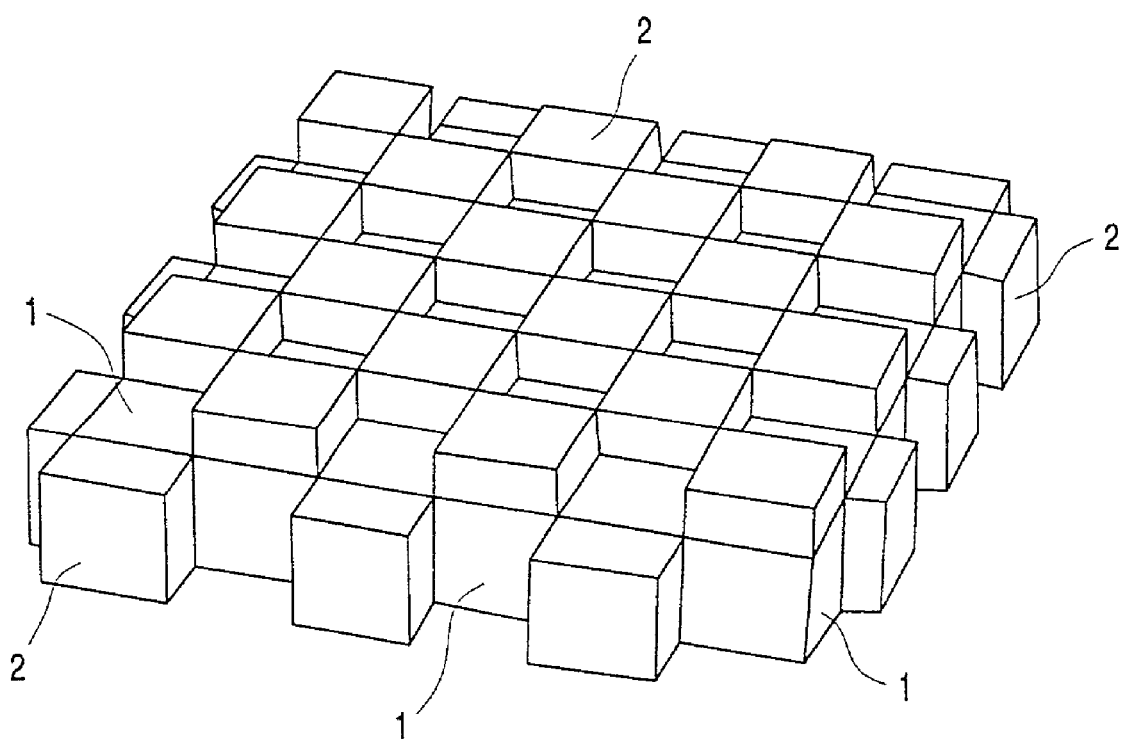
FIG. 1 diagrammatically shows a light-emitting device.

As shown in FIG. 1, a light-emitting diode comprises an InGaN chip 1 having a light-emitting chip surface. On the lower side of the chip there are electric connectors. A phosphor layer is applied to the chip surface by means of screen printing. In this example, said layer is formed by small phosphor blocks 2, which are arranged in accordance with a chessboard pattern. The surface of the chip covered with the phosphor blocks 2 forms the covered sub-surface of the chip, the surface covered by an individual block 2 being referred to as a partial sub-surface. The phosphor layer may be, for example, a TG:Eu phosphor.

If an electric voltage is applied to the InGaN chip, then this chip emits blue light of a wavelength of approximately 480 nm. Subsequently, the blue light issues freely to the exterior through the uncovered sub-surface. The blue light incident on the sub-surface covered with the phosphor blocks 2, however, is absorbed by the phosphor blocks and converted to yellow light of a wavelength of approximately 575 nm. The phosphor layer is sufficiently thick, so that all of the blue light incident thereon is converted to yellow light. Subsequently, this yellow light also issues to the exterior and can mix with the blue light.

Since the phosphor pattern on the diode is very fine, the human eye will not distinguish the two colors issuing from the diode, but will observe only one mixed color, in this case a substantially white light. By varying the ratio between the phosphor-covered sub-surface and the uncovered sub-surface, different color temperatures can be achieved. In this example, said ratio is 1:1.

Figure 2:
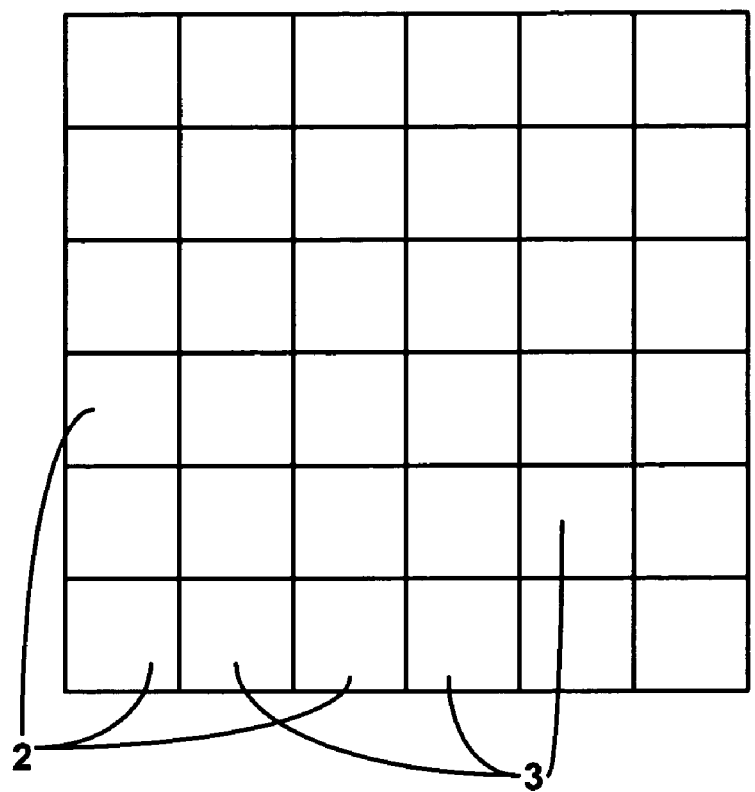
FIG. 2 is a top view of an alternative embodiment of a light-emitting device.
Figure 3:
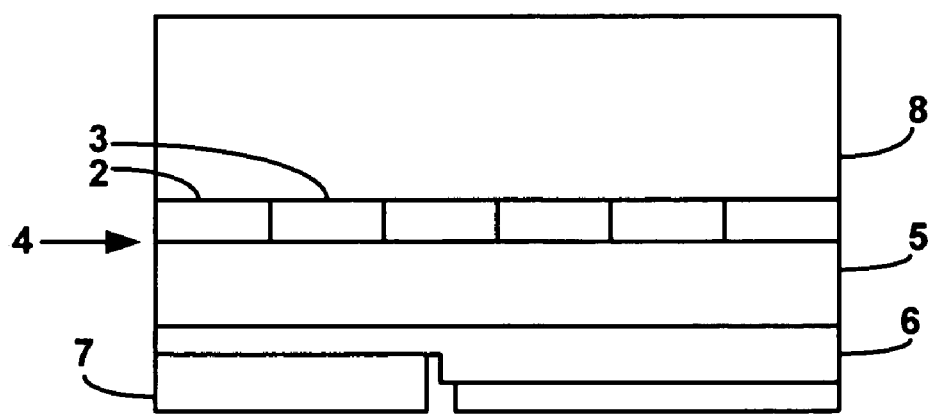
FIG. 3 is a side view of an alternative embodiment of a light-emitting device.

FIG. 2 is a top view of an alternative embodiment of a light-emitting device. FIG. 3 is a side view of an alternative embodiment of a light emitting device. In the device of FIGS. 2 and 3, phosphor blocks 2 are formed on the light emitting surface 4 of a substrate 5 of an InGaN light emitting diode 4. Electrical connectors 7 are disposed on the side of the device opposite the phosphor blocks 2. The regions of surface 4 without phosphor are covered with blocks of a light-transmitting layer 3, which is capable of spreading light incident on that portion of surface 4. FIG. 3 illustrates that the thickness of the light-transmitting blocks may be selected such that the top surface of phosphor blocks 2 and light-transmitting blocks 3 is a flat surface. The device of FIG. 3 includes an optional optical element 8, which mixes the light emitted by phosphor blocks 2 and light-transmitting blocks 3, to eliminate undesirable color-separation effects.

In some applications, the light issuing from the diode is projected onto an object by means of lenses, in which case enlargement may still lead to undesirable color-separation effects. This can be precluded by accommodating optical elements in the lighting device, which mix light of the two colors.

The invention claimed is:

1. A light-emitting device comprising:
   a semiconductor light emitting diode capable of emitting light of a first wavelength, the semiconductor light emitting diode having a top surface and a bottom surface, the top surface comprising a light-emitting surface,
   electrical connectors formed on the bottom surface of the semiconductor light emitting diode, the electrical connectors being configured to apply an electric voltage to the semiconductor light emitting diode, and
   a plurality of regions of phosphor provided on the light-emitting surface, wherein:
      at least some of the plurality of regions of phosphor are capable of converting light of the first wavelength to visible light of a second wavelength;
      the plurality of regions of phosphor form a pattern; and
      the plurality of regions of phosphor are separated by regions of the light-emitting surface without phosphor.

2. A device as claimed in claim 1, wherein the regions of the light-emitting surface without phosphor are at least partly covered with a light-transmitting layer.

3. A device as claimed in claim 2, wherein a thickness of the light-transmitting layer is substantially the same as a thickness of phosphor in the regions of phosphor.

4. A device as claimed in claim 1, wherein the pattern is a chessboard pattern.

5. A device as claimed in claim 1, wherein composite light emitted from the device, the composite light comprising light of the first wavelength and light of the second wavelength, appears substantially white.

6. A device as claimed in claim 1, wherein the thickness of the phosphor layer is such that all the light of the first wavelength incident on the phosphor layer is converted to light of a different wavelength.

7. A device as claimed in claim 1, wherein others of the plurality of regions of phosphor are capable of converting light of the first wavelength to visible light of a third wavelength.

8. A device as claimed in claim 1, further comprises at least one optical element for mixing the emitted light of the first and the second wavelength.

* * * * *